United States Patent [19]

Polvani

[11] Patent Number: 4,766,385
[45] Date of Patent: Aug. 23, 1988

[54] UNDERWATER BURIED MINE CLASSIFIER

[75] Inventor: Donald G. Polvani, Arnold, Md.

[73] Assignee: Westinghouse Electric Corp., Pittsburgh, Pa.

[21] Appl. No.: 94,187

[22] Filed: Sep. 8, 1987

[51] Int. Cl.$^4$ .............................................. G01V 3/165
[52] U.S. Cl. .................................................. 324/345
[58] Field of Search ................................ 324/326–329, 324/330, 331, 345, 207, 208, 244, 245, 260, 262, 267; 89/1.11, 1.13; 114/221 R, 221 H, 242, 244

[56] References Cited

U.S. PATENT DOCUMENTS

| | | | |
|---|---|---|---|
| 3,263,161 | 7/1966 | Ruddock et al. | 324/345 X |
| 3,324,385 | 6/1967 | Hings | 324/345 |
| 3,412,371 | 11/1968 | Shostak | 324/345 X |
| 3,946,696 | 3/1976 | Lubnow | 89/1.13 X |
| 4,021,725 | 5/1977 | Kirkland | 324/345 X |
| 4,427,943 | 1/1984 | Cloutier et al. | 324/345 X |

Primary Examiner—Reinhard J. Eisenzopf
Assistant Examiner—Warren S. Edmonds
Attorney, Agent, or Firm—D. Schron

[57] ABSTRACT

A magnetometer system carried aboard a tethered underwater vehicle for confirming the existence of a buried naval mine which then may be neutralized by an explosive charge dropped by the vehicle. The vehicle carries two or more scaler magnetometers and is operated to obtain vertical and two orthogonal horizontal spatial gradients of the magnetic field above the mine location. The vertical distance to the mine is obtained, and this information, along with the known dip angle of the earth's magnetic field at the location, is utilized in conjunction with the spatial gradients for obtaining three mutually orthogonal components of the magnetic moment of the mine, from which the magnitude of the magnetic moment may be calculated. If the magnitude falls between upper and lower predetermined limits, a positive mine classification signal is provided.

12 Claims, 4 Drawing Sheets

UNDERWATER BURIED MINE CLASSIFIER

BACKGROUND OF THE INVENTION

1. Field of the Invention

The invention in general relates to the detection of ferrous objects, and particularly, to a system for determining whether or not an object detected in the bed of a body of water is likely to be a naval mine.

2. Description of the Prior Art

Sonar systems, particularly side-looking sonar systems, are adept at detecting naval mines lying on, or moored just above the bed of a body of water. Mine detection becomes more difficult, and in some cases impossible, when the mine is buried in the bottom.

A number of magnetic systems have been developed for mine detection, one outstanding example of which is the superconducting gradiometer system. This type of system utilizes several pairs of superconducting magnetometers to measure spatial gradients of the static magnetic field produced by the mine. Such systems must carry cryogenic cooling equipment containing liquid helium for proper magnetometer operation and very sophisticated computing equipment is required for the complex signal processing performed.

Very often a detected mine is neutralized by depositing and detonating an explosive charge over its detected location. Although the superconducting gradiometer system is excellent for detecting the mine, it is a far too costly system to risk for delivering an explosive charge for mine neutralization.

The present invention is a relatively inexpensive scalar gradiometer system which can reacquire a previously detected mine, can add independent verification as to whether the detected object is a mine, and can be utilized in the mine neutralization process. In case of an accident which would damage or destroy the system, the system could be repaired or replaced at a much lower cost than the superconducting gradiometer arrangement. Further, the present invention does not require complex cryogenic cooling equipment for operation, and makes use of relatively simple signal processing equipment and algorithms.

SUMMARY OF THE INVENTION

In its broadest aspect, the apparatus of the present invention determines the magnetic moment of an underwater magnetic anomaly which may be buried in a bed of a body of water. The system includes an underwater platform which can be guided to a position above the anomaly. The platform carries a sensor system which includes in one embodiment two vertically separated scaler magnetometers. Each magnetometer provides output signal proportional to the magnitude of the magnetic field of the anomaly at the position of the magnetometer. Computing means are provided to obtain indications of the spatial gradient of the magnetic field in three mutually perpendicular directions constituting an X, Y, Z Cartesian coordinate system. The computing means utilizes these indications along with an indication of the vertical distance between the sensor system and the anomaly as well as the indication of the dip angle of the earth's magnetic field at the location of the anomaly to obtain the vertical and horizontal components of the magnetic moment of the anomaly. From these components, a value for the magnitude of the magnetic moment is obtained. This magnitude may be compared with predetermined lower and upper threshold values, and, if the magnitude falls between these threshold values, a mine-like target is verified.

DESCRIPTION OF THE PREFERRED EMBODIMENT

Although the present invention is broadly applicable for determining the magnetic moment of an underwater magnetic anomaly, it will be described with respect to the detection and classification of a buried naval mine.

Figure 1:
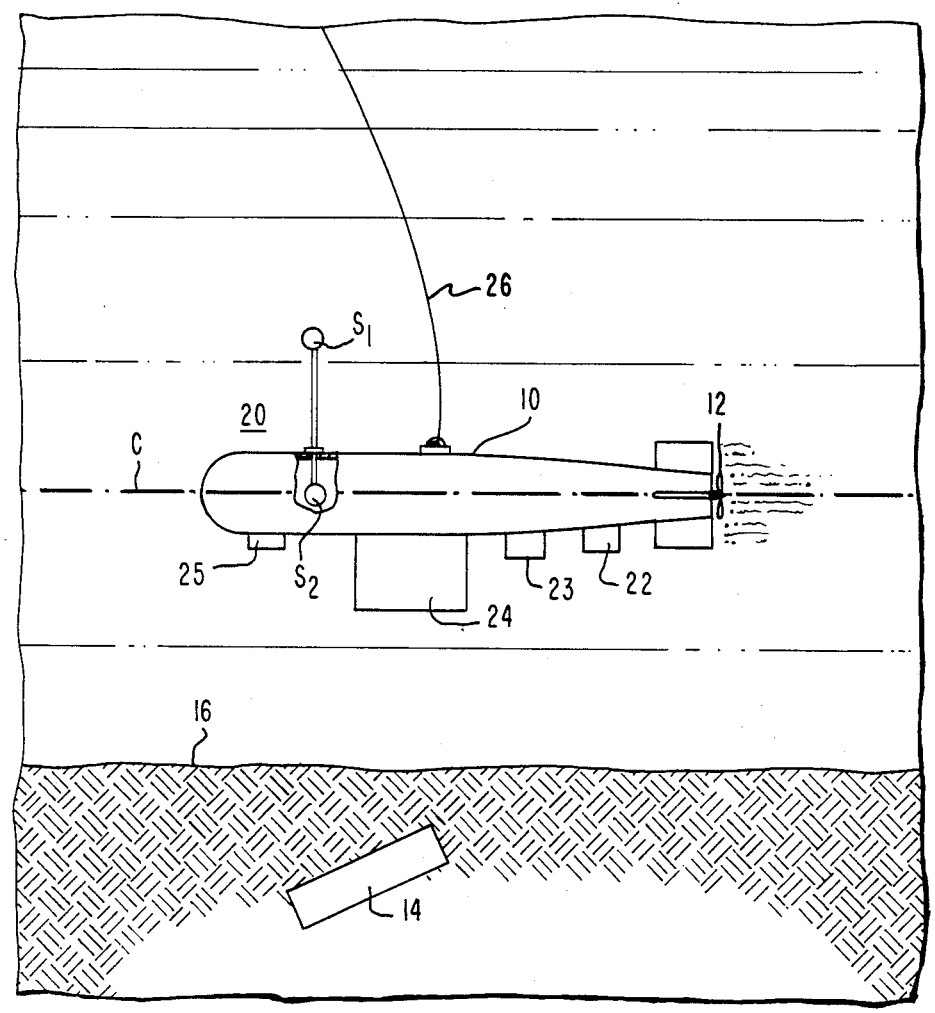
FIG. 1 illustrates an underwater environment in which the present invention finds application.

In FIG. 1 an underwater platform 10 having propulsion means 12 is guided to the location of a previously detected naval mine 14 buried in the bottom 16 of a body of water.

Figure 2:
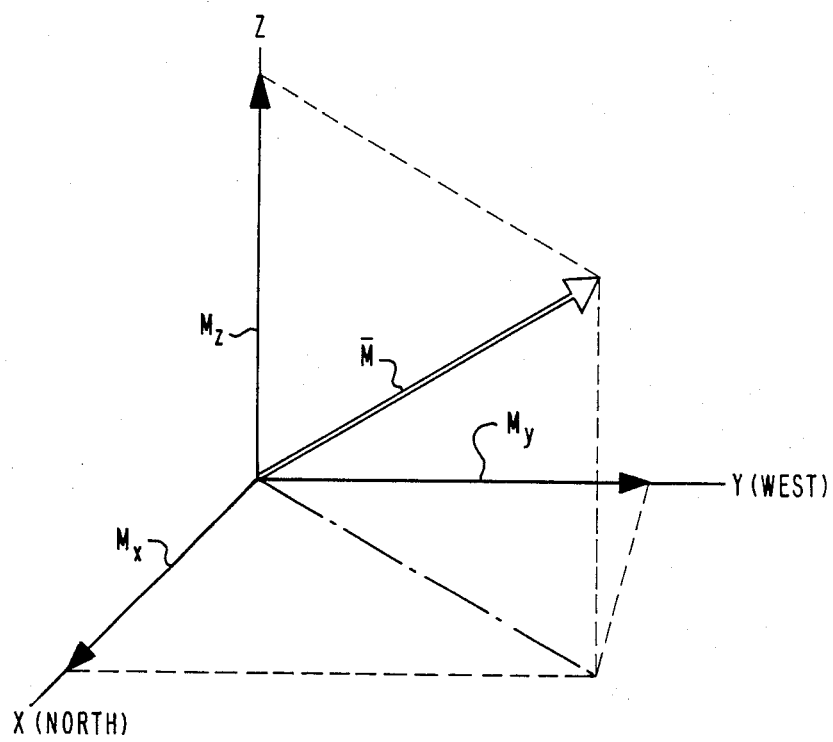
FIGS. 2 and 2A show X, Y, Z Cartesian coordinate systems illustrating the orientation of magnetic moment.

Platform 10 is of non-magnetic material and carries a sensor system 20 which, in the embodiment of FIG. 1, includes two vertically separated scaler magnetometers $S_1$ and $S_2$, with magnetometer $S_2$ being disposed within the platform and along its central longitudinal axis C. In addition to the sensor system, the platform carries an altitude sonar 22 for determining the altitude of the platform above the water bottom, a Doppler navigation sonar 23 for precisely positioning the platform, and a payload 24 for carrying one or more neutralization charges to be dropped over a detected mine location and thereafter exploded. Heading sensor 25 gives the heading of the platform with respect to magnetic north. Although the platform may be an autonomous vehicle, it is illustrated in FIG. 1 as being tethered, with the tether line 26 being connected, for example, to a surface vessel or helicopter. The tether line 26 also functions to carry transmitted signals to and from the platform. In order to gain a better understanding of the signal processing to be described, reference is made to FIG. 2 which illustrates a magnetic moment vector in an X, Y, Z Cartesian coordinator system. The magnetic moment $\overline{M}$ is a vector quantity having a magnitude M in a certain direction relative to the coordinate system and which gives rise to three components of the magnetic moment along the three mutually perpendicular axes X, Y and Z of the coordinate system. These components are designated $M_x$, $M_y$ and $M_z$, respectively.

Figure 2A:
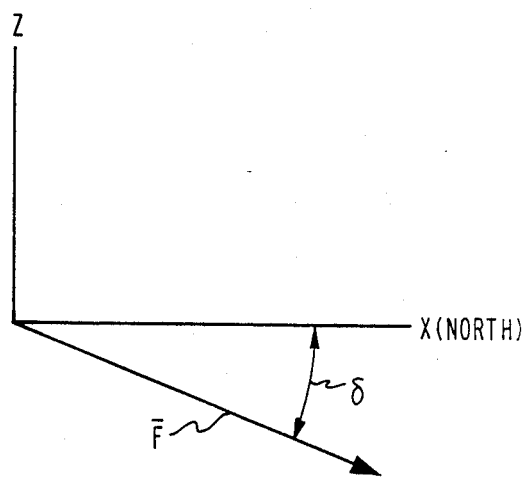
Figure 3:
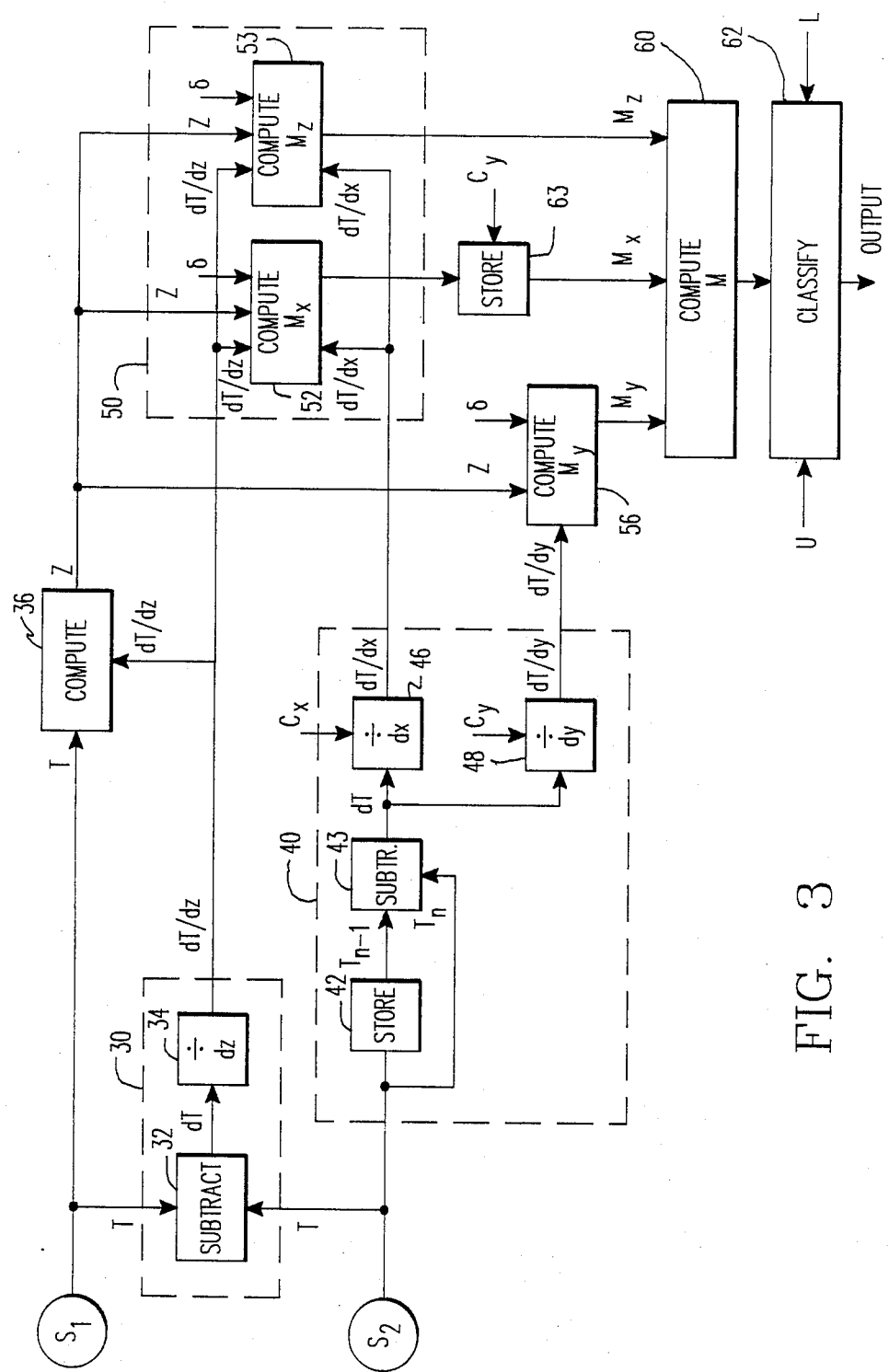
FIG. 3 is a block diagram illustrating the operation of the present invention.

With reference to FIG. 2A, the vector $\overline{F}$ is a vector representing the earth's magnetic field at the detection location and the angle $\delta$, known as the dip angle, is equal to the angle between the earth's magnetic field $\overline{F}$ and the X axis, arbitrarily assuming that the X axis is horizontal and points northward. The generation and processing of various signals to obtain an indication of the magnitude of a magnetic moment is illustrated in FIG. 3 to which reference is now made.

Magnetometer sensors $S_1$ and $S_2$ are well known, relatively inexpensive, conventional scaler magnetometers such as commercially available proton magnetometers. These magnetometers are usually pulsed units and provide respective pulsed output signals indicative of the magnitude of the magnetic field of the buried mine at the position of the magnetometer. In FIG. 3, each of the magnetometers provides a respective output signal T and first circuit means 30 is provided for obtaining an indication of the vertical spatial gradient of the magnetic field. This may be accomplished with the provision of subtraction circuit 32 which subtracts the output of the two magnetometers, yielding a differential dT which is divided, in circuit 34, by the known spatial separation dz of the magnetometers.

An indication of the vertical distance Z between the sensor system (the center thereof) and the buried mine (the center thereof) may be obtained in one of two ways. One way is an estimate from a knowledge of the platform altitude provided by the platform's altitude sonar coupled with an estimate of the burial depth of a typical mine. An alternate method for obtaining the distance Z, as illustrated in FIG. 3, computes the value by means of circuit 36 which, in a well known manner used in geological exploration, provides an output indication Z in response to the output T from one of the magnetometers as well as the vertical spatial gradient dT/dz in accordance with the following equation 1:

$$Z = -3T/(dT/dz) \tag{1}$$

A second circuit means 40 is provided for deriving indications of two orthogonal horizontal spatial gradients dT/dx and dT/dy of the magnetic field. These values may be obtained by successively sampling the output of one of the magnetometers as the platform travels predetermined increments in a first direction and thereafter repeating the procedure for travel in a direction orthogonal to the first direction. The first direction is chosen along the northward pointing X axis of an X, Y, Z Cartesian coordinate system, while the other direction is along the westward pointing Y axis, both in a horizontal plane. For a two magnetometer sensor system as illustrated, the values may be obtained with the provision of a store circuit 42 which stores the magnetometer output at one position, and a subtract circuit 43 which subtracts the just previous reading $T_{n-1}$ from the current reading $T_n$ to yield a dT value in the direction of travel. For travel along the X axis, a control signal $C_x$ activates division circuit 46 yielding the X axis spatial gradient dT/dx, while circuit 48, activated by control signal $C_y$, yields the y spatial gradient dT/dy.

A third circuit means 50 is responsive to various signals for generating the vertical component $M_z$ and one horizontal component $M_x$ of the magnetic moment of the mine. More particularly, the third circuit means 50 includes a first computation circuit 52 for generating $M_x$ in accordance with the following equation 2:

$$M_x = \frac{(Z^4/3)[\cos(\delta)(dT/dz) - 2\sin(\delta)(dT/dx)]}{\cos^2(\delta) + 2\sin^2(\delta)} \tag{2}$$

and computation circuit 53 is provided for generating $M_z$ in accordance with the following equation 3:

$$M_z = \frac{(Z^4/3)[\cos(\delta)(dT/dx) + \sin(\delta)(dT/dz)]}{\cos^2(\delta) + 2\sin^2(\delta)} \tag{3}$$

A value for dip angle $\delta$ is a priori known and is provided to the computation circuits 52 and 53, as is the vertical distance indication from circuit 36, the vertical spatial gradient indication from circuit 34, and the X horizontal spatial gradient from circuit 46.

A fourth circuit means in the form of computation circuit 56 is responsive to the $\delta$ and Z indications, as well as, the Y direction horizontal spatial gradient dT/dy to generate an indication of the horizontal component $M_y$ of the magnetic moment in accordance with equation 4:

$$M_y = \frac{-(Z^4/3)(dT/dy)}{\sin(\delta)} \tag{4}$$

Thus having the three orthogonal components $M_x$, $M_y$, and $M_z$, the magnitude M of the magnetic moment may be calculated in circuit 60 by utilizing the well-known relationship of equation 5:

$$M = (M_x^2 + M_y^2 + M_z^2)^{\frac{1}{2}} \tag{5}$$

Store circuit 63 holds the most recent value of $M_x$, obtained when the platform traveled along the x axis, until control signal $C_y$ releases this value of $M_x$ to circuit 60. A typical naval mine will have a magnetic moment magnitude which generally falls between predetermined upper and lower limits. In order to verify that the readings indicate that a mine is present, a classification circuit 62 is provided and is operable to compare the output magnitude M from circuit 60 with an upper threshold value U and a lower threshold value L to provide an output signal indicative of a mine classification. This signal may be provided to an operator aboard the surface vessel (or helicopter) via the tether line.

In order for this approach to yield accurate results from equations 1–5, it is necessary that all computations be done at a point almost directly over the mine. The position of the mine is assumed to be known apriori and is arbitrarily taken as occuring at x=0 and y=0. The Doppler navigation sonar 23 in FIG. 1 is used to determine the underwater platform's position with respect to that of the mine. When the platform is precisely positioned over the mine, in the two orthogonal directions previously discussed, the predetermined increments are run, control signals $C_x$ and $C_y$ are issued (as appropriate), and the computations of FIG. 3 are performed.

Figure 4A:
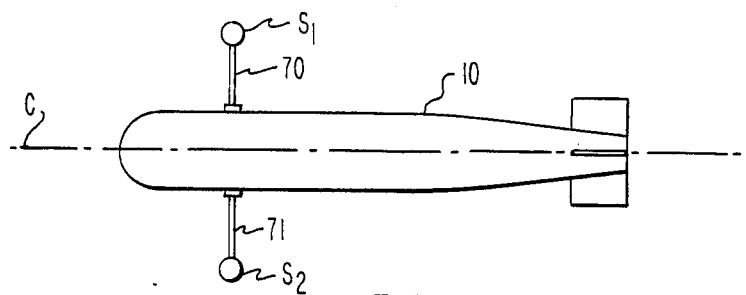
FIGS. 4A through 4C illustrate alternate magnetometer sensor placements on the underwater platform.
Figure 4B:
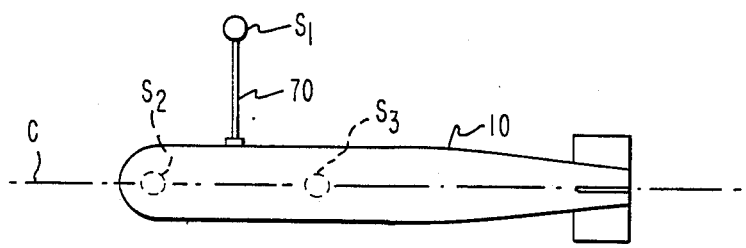
Figure 4C:
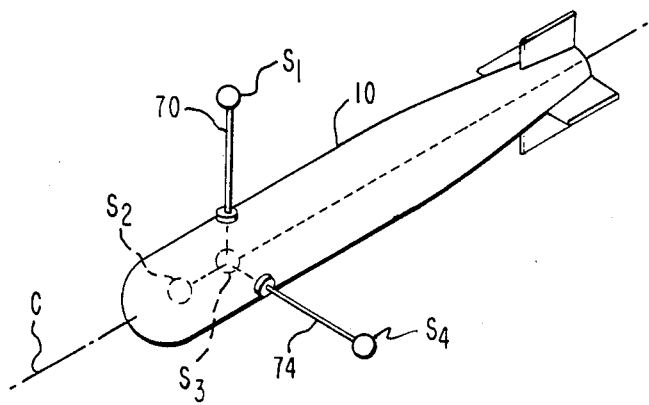

FIGS. 4A through 4C illustrate several different embodiments of a magnetometer sensor system. In FIG. 4A magnetometers $S_1$ and $S_2$ are vertically displaced from one another above and below the platform 10 by means of non-magnetic booms 70 and 71. With this arrangement, each magnetometer is as far away as possible from any interfering magnetic signals which may arise from the platform itself or from other apparatus carried by the platform.

In FIG. 4B, magnetometer $S_1$ is as in FIG. 4A, however, two other magnetometers $S_2$ and $S_3$ are disposed inside the platform body along the center line C thereof. Magnetometers $S_2$ and $S_3$ will allow a direct measurement of the X axis (or Y axis) gradient (by direct subtraction of their outputs and division by their separation) and would yield a greater accuracy in this measurement as well as allow for cancellation of geomagnetic noise which occurs simultaneously in both magnetometers. With the embodiment of FIG. 4B a vertical, or Z axis, gradient may be obtained by averaging the readings from magnetometers $S_2$ and $S_3$ to obtain an average reading centered between them along center line C and vertically below magnetometer $S_1$.

In FIG. 4C, four magnetometers $S_1$ through $S_4$ are utilized to provide simultaneous measurements of the X, Y, and Z axis gradients. The X axis gradient may be obtained from magnetometers $S_2$ and $S_3$ whereas the Y axis gradient may be simultaneously obtained from magnetometers S₃ and S₄, the latter being mounted on an athwartship non-magnetic boom 74. The Z axis gradient is simultaneously obtained from magnetometers S₁, S₂, and S₃ in the manner just described for FIG. 4B. The embodiment of FIG. 4C would provide the highest accuracy in its measurements and would also allow for cancellation of distant geomagnetic noise which occurs equally in all of the magnetometers.

Thus, there has been described a system which determines the magnitude of the magnetic moment of a bottom resting or buried magnetic anomaly such as a naval mine. The system utilizes relatively inexpensive scaler magnetometers, and the signal processing illustrated in FIG. 3 for the components $M_x$, $M_y$, $M_z$ of the magnetic moment involves the simple solution of equations linear in the computed spatial gradients (equations 2 to 4). The solutions to all the equations involved may be obtained by a microchip microprocessor, in which case suitable analog-to-digital conversion circuitry would be provided for the magnetometer output signals.

What is claimed is:

1. Apparatus for determining the magnetic moment of an underwater magnetic anomaly which may be buried in the bed of a body of water comprising:
   (A) an underwater platform including means for guiding said platform to a position above said anomoly;
   (B) a sensor system carried by said platform and including at least two vertically separated scalar magnetometers each operable to provide a respective output signal proportional to the magnitude of the magnetic field of said anomaly at the position of the magnetometer;
   (C) first means responsive to the outputs of said sensor system for obtaining an indication of the vertical spatial gradient of said magnetic field (dT/dz);
   (D) means for providing an indication of the vertical distance (Z) between said sensor system and said anomaly;
   (E) means for providing an indication of the dip angle (δ) of the earth's magnetic field at the location of said anomaly;
   (F) second means responsive to the outputs of said sensor system for obtaining indications of two orthogonal horizontal spatial gradients of said magnetic field (dT/dx and dT/dy);
   (G) third means responsive to said indications of vertical distance, dip angle, vertical and one horizontal spatial gradients for obtaining indications of the vertical and one of two orthogonal horizontal components of the magnetic moment of said anomaly;
   (H) fourth means responsive to said indications of vertical distance, dip angle, and the other one of said horizontal spatial gradients for obtaining an indication of the other horizontal component of the magnetic moment of said anomaly; and
   (I) means responsive to said vertical and horizontal magnetic moment components to obtain an indication of the magnitude of said magnetic moment.

2. Apparatus according to claim 1 which includes:
   (A) means for comparing said magnitude of said magnetic moment with predetermined upper and lower threshold values.

3. Apparatus according to claim 1 which includes:
   (A) circuit means responsive to said output signal from one of said magnetometers and said vertical spatial gradient to generate said vertical distance indication.

4. Apparatus according to claim 1 wherein:
   (A) said platform is an underwater vehicle having an interior and a longitudinal axis; and wherein,
   (B) said sensor system includes (i) at least one magnetometer mounted on a vertical boom connected to said vehicle, and (ii) at least one magnetometer disposed in the interior of said vehicle.

5. Apparatus according to claim 4 wherein:
   (A) said interior magnetometer is positioned vertically below the boom-mounted magnetometers and on said longitudinal axis 6. Apparatus according to claim 4 wherein:
   (A) said platform is an underwater vehicle having an interior and a longitudinal axis, wherein,
   (B) said sensor system includes (i) at least one magnetometer mounted on a vertical boom connected to said vehicle, and (ii) at least two magnetometers disposed in the interior of said vehicle, spaced apart along said longitudinal axis.

7. Apparatus according to claim 6 which includes:
   (A) a fourth magnetometer mounted on a horizontal boom connected to said vehicle.

8. Apparatus according to claim 1 wherein:
   (A) said platform is tethered and the tether includes means for transmitting signals to and from said platform.

9. Apparatus according to claim 1 wherein:
   (A) said platform additionally carries an altitude sonar for obtaining an indication of platform height above said bed.

10. Apparatus according to claim 2 wherein:
    (A) said platform additionally carries ejectable explosive charges for depositing over said anomaly if said magnetic moment is between said threshold values.

11. Apparatus according to claim 1 wherein:
    (A) said means for guiding includes navigation sonar carried by said platform.

12. Apparatus according to claim 11 which includes:
    (A) a heading sensor carried by said platform.

* * * * *